United States Patent [19]
Annavarapu et al.

[11] Patent Number: 6,010,583
[45] Date of Patent: Jan. 4, 2000

[54] METHOD OF MAKING UNREACTED METAL/ALUMINUM SPUTTER TARGET

[75] Inventors: Suresh Annavarapu, Edgewater, N.J.; John Ettlinger, W. Nyack; Tony Sica, Mt. Vernon, both of N.Y.

[73] Assignees: Sony Corporation, Tokyo, Japan; Materials Research Corporation, Orange, N.Y.

[21] Appl. No.: 08/926,375

[22] Filed: Sep. 9, 1997

[51] Int. Cl.[7] ........................................ B22F 3/02
[52] U.S. Cl. .............................. 148/513; 419/23; 419/32; 419/68
[58] Field of Search .................... 419/23, 32, 62, 419/65, 68; 148/513, 514

[56] References Cited

U.S. PATENT DOCUMENTS

| | | | |
|---|---|---|---|
| 3,877,930 | 4/1975 | Volin | 419/32 |
| 4,554,130 | 11/1985 | Ecer | 419/68 |
| 4,752,335 | 6/1988 | Korb | 419/68 |
| 4,788,611 | 11/1988 | Kobayashi et al. | 360/120 |
| 4,832,741 | 5/1989 | Couper | 419/62 |
| 4,921,664 | 5/1990 | Couper | 419/68 |
| 5,439,500 | 8/1995 | Marx | 75/246 |
| 5,594,186 | 1/1997 | Krause et al. | 419/23 |

*Primary Examiner*—George Wyszomierski
*Attorney, Agent, or Firm*—Wood, Herron & Evans L.L.P.

[57] ABSTRACT

A high performance, high density sputtering target and a method of making. An aluminum and non-aluminum reactive metal powder blend is subjected to cold pressing under pressure, machining, evacuating, and hot pressing under pressure. The aluminum and non-aluminum metal react directly to yield a high performance, high density sputter target containing greater than about 2% aluminum with substantially uniform composition across the body.

23 Claims, 3 Drawing Sheets

FIG. IC

METHOD OF MAKING UNREACTED METAL/ALUMINUM SPUTTER TARGET

FIELD OF THE INVENTION

This invention relates generally to sputtering targets, and more specifically to methods of making high performance, high density sputtering targets composed of aluminum and a non-aluminum metal.

BACKGROUND OF THE INVENTION

Sputtering targets are used in the formation of semiconductor substrates as a source of material to be deposited on the substrates. In some applications layers of alloys composed of one or more metals are deposited onto the surface of a substrate to improve performance and characteristics of individual products. For example, magnetron sputtering is a widely used method to deposit thin layers of aluminum and non-aluminum metal alloys onto flat and patterned substrates. The fabricated substrates are then used in the manufacture of products such as integrated circuits, memory storage devices, magnetic recording or reproducing apparatus, and ink-jet heads.

Metals to be deposited on a semiconductor substrate are removed from the sputtering target by a plasma. The quality of the resultant semiconductor substrate depends on the quality of the sputtering target supplying the material, which in turn depends on the quality of its fabrication. The fabrication of the sputtering target, in particular the target composition and structure, is important in achieving a high performance, high density substrate.

Improperly fabricated sputtering targets have several undesirable features such as low density, the presence of intermetallic compounds, and a non-uniform composition. Low density sputtering targets are undesirable because they cause outgassing during pumpdown, where air trapped in the target either increases the time for the desired level of vacuum to be reached, or prevents the necessary vacuum from being reached at all, thus reducing uptime of the target. Additionally, impurities in the air trapped in the target can contaminate the film. Intermetallic compounds are brittle and may result in sputtering target failure during fabrication or operation. A non-uniform composition of the sputtering target is undesirable because it reduces the substrate yield, since the non-uniform composition is reproduced on the film coating the substrate.

One method of solving the problem of improperly fabricated or nonhomogeneous sputtering targets, and hence the problem of reduced substrate yield, has been to use separate targets as sources for the aluminum and the non-aluminum metal. This method, however, is inefficient in that the sputtering targets must be mechanically rotated to average out the composition from each metal. Additionally, mechanical rotation has only been used when the non-aluminum metal was tantalum, thus its applicability to non-aluminum metals other than tantalum is unknown.

It would be advantageous to fabricate a sputtering target that is a homogeneous composition of an unreacted aluminum and non-aluminum metal and that contains greater than about 2% to 5% by weight of aluminum. This would be sufficient to allow formation of an aluminum layer around the non-aluminum metal. Therefore, a high quality, high performance, substantially uniform sputtering target, and an efficient method of fabricating such a target, is needed.

SUMMARY OF THE INVENTION

To this end, the present invention provides a method of making a high performance, high density sputter target composed of a homogeneous mixture of aluminum and a non-aluminum metal.

The present invention also provides a sputter target formed by the method of the invention. Such a sputter target has high performance, high purity, and is a composition, structure and density that is substantially uniform across the body of the sputter target.

The present invention also provides a high performance, high density sputter target that is a hot pressed evacuated machined cylinder of a cold pressed blend of a non-aluminum metal powder and an aluminum powder.

According to one embodiment, a non-aluminum reactive metal such as titanium, tantalum, niobium, zirconium, iron or nickel, is fabricated into a powder by a hydride-dehydride process. In alternative embodiments, the powder may be fabricated by a sodium reduction process or an inert gas atomization process. The non-aluminum reactive metal powder may have a spheroidal, angular, or granular morphology. The non-aluminum metal powder is preferably between about 6 $\mu$m and about 300 $\mu$m, and is most preferably between about 6 $\mu$m and about 45 $\mu$m. An aluminum metal body is also fabricated into a powder by a mechanical comminution process or an inert-gas atomization process. The aluminum powder, which may have a spheroidal morphology, is preferably less than about 300 $\mu$m and is most preferably less than about 45 $\mu$m.

The non-aluminum and aluminum powders are blended with 1" long×0.5" wide cylinders of pure aluminum for at least 2 hours. A solvent such as alcohol or acetone, or a binder such as stearic acid or stearates may be added to the powders to enhance blending. The blend is subjected to cold pressing in either a uniaxial, biaxial or hydrostatic direction. In a preferred embodiment, the blended powders are subjected to cold isostatic pressing at a pressure of about 30 ksi to form a blank. The blanks are machined into a right cylinder, then the cylinder is subjected to hot pressing under a vacuum. Hot pressing is preferably performed at at least about $10^{-3}$ torr at a temperature less than 0.9 times the melting temperature in degrees Kelvin of aluminum (0.9 $T_m$ of aluminum) and at a pressure of at least about 5 ksi.

In an alternative embodiment, a non-aluminum reactive metal powder is blended with an aluminum powder. The blend is subjected to cold pressing and is then assembled into a mosaic. The mosaic is subjected to either hot isostatic pressing, vacuum hot pressing, inert gas hot pressing, or pressure-less sintering at a temperature below 0.9 $T_m$ of aluminum.

The unreacted non-aluminum metal/aluminum sputter target formed is a high performance, high density sputter target. It has a substantially uniform composition, structure and density across the body of the target and a non-aluminum metal average particle size of about 30 $\mu$m.

By virtue of the foregoing, there is thus provided a sputter target of aluminum and a non-aluminum reactive metal containing greater than about 2% to 5% by weight of aluminum and a method of making such a sputter target. These and other objects and advantages of the present invention shall be made apparent from the accompanying description thereof.

BRIEF DESCRIPTION OF THE FIGURES

FIGS. 1A, 1B, and 1C are a series of photomicrographs showing a sputter target made by an early unrefined method of the present invention.

DETAILED DESCRIPTION

Figure 1A:
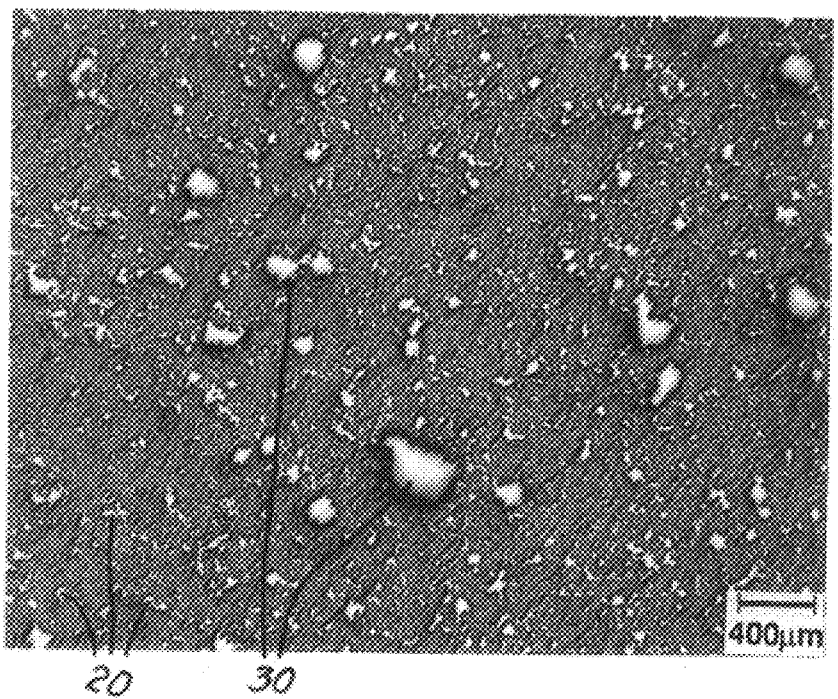
Figure 1B:
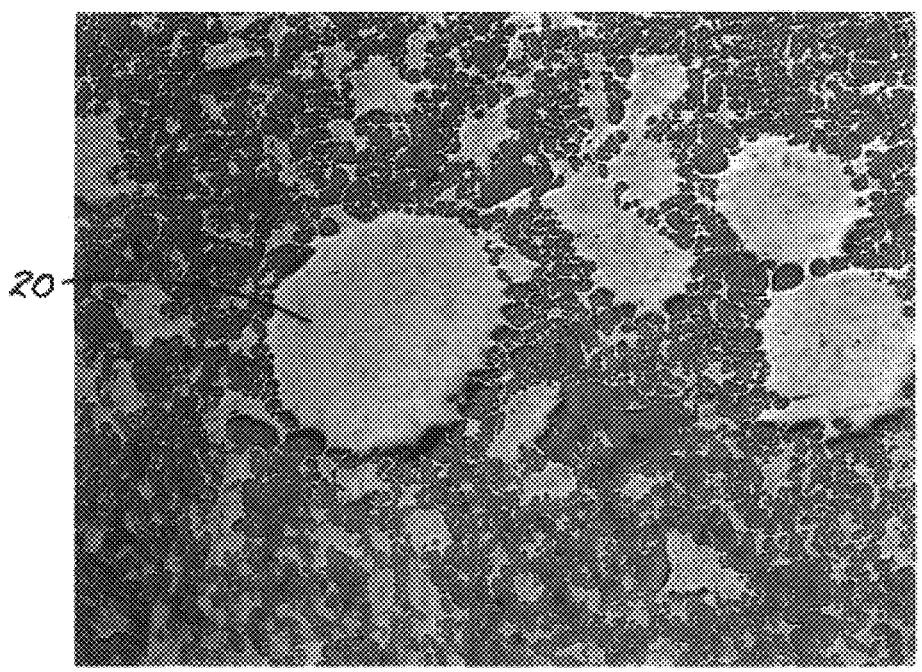

With reference to FIGS. 1A, 1B, and 1C and FIGS. 2A, 2B and 2C, a high performance, high purity sputter target is formed by the method of the present invention. The sputter target is composed of a substantially homogeneous mixture of an aluminum and a non-aluminum metal. As shown in FIG. 1A, an early unrefined method of the present invention produced a sputter target with macroscopic segregation of the aluminum particles 20, resulting in aluminum agglomerate 30. The agglomerates 30 are an irregularly-shaped collection of at least about four to five aluminum particles 20 with an aggregate size of at least about 50 μm. As shown in FIG. 1B, the early unrefined method produced a sputter target showing microsegregation of aluminum powder particles 20 of about 100–200 μm in diameter. As shown in FIG. 1C, the early unrefined method produced a sputter target having a microstructure which showed an interfacial reaction layer 40 between the aluminum 20 and the non-aluminum metal 60 particles.

Figure 2A:
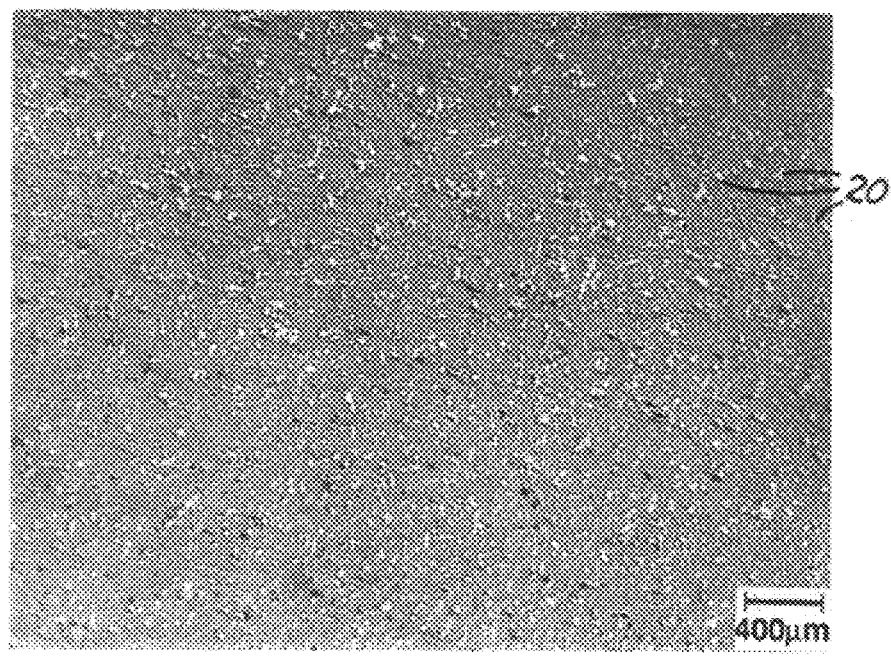
FIGS. 2A, 2B, and 2C are a series of photomicrographs showing a sputter target made by the method of the present invention.
Figure 2B:
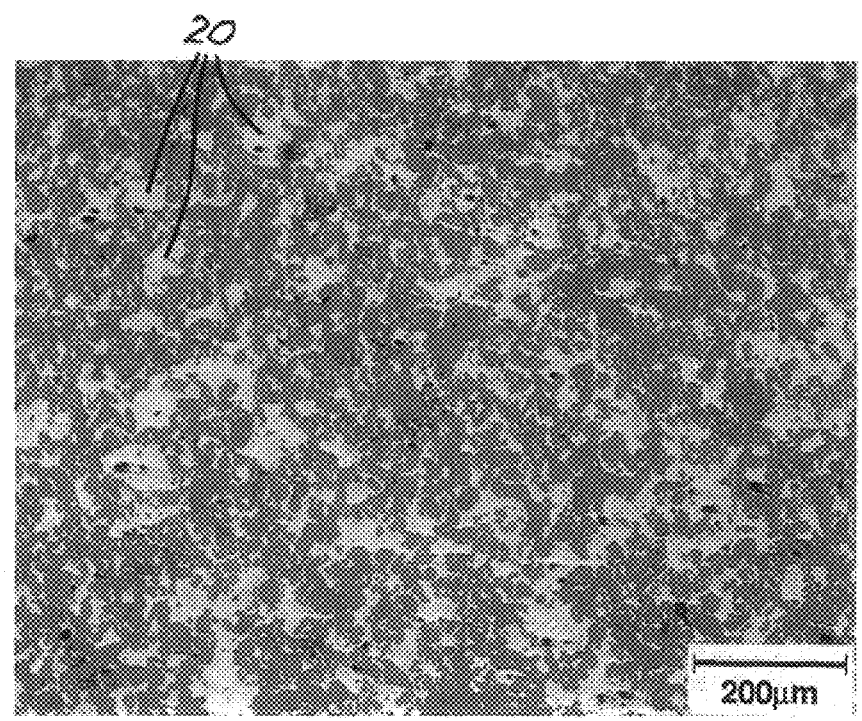
Figure 2C:
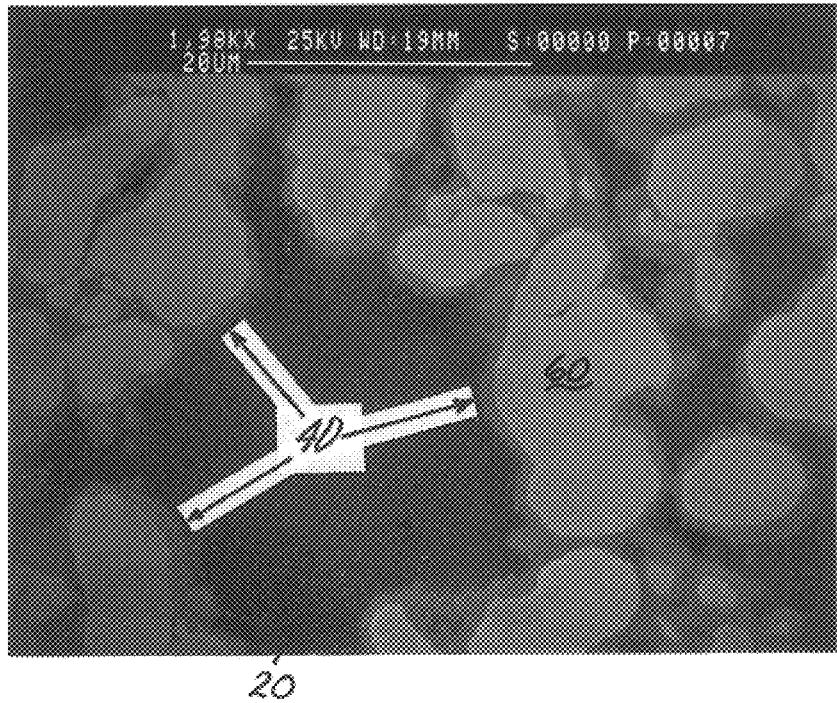
Figure 2C:
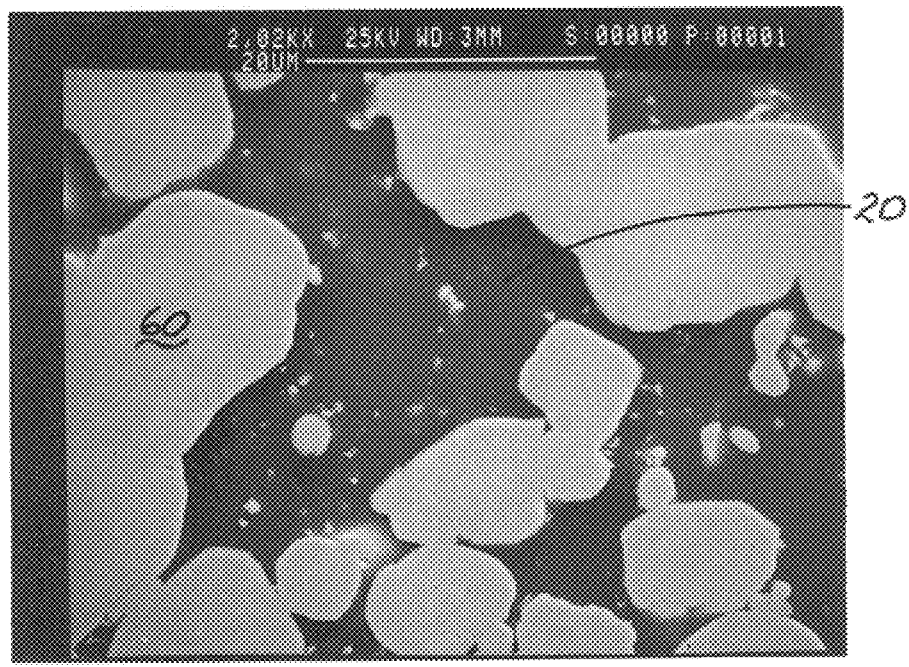

The method of the present invention is an improvement of the early, unrefined process. The method of the present invention, as shown in FIG. 2A, produces a sputter target with no macroscopic segregation of the aluminum particles 20 into agglomerates 30 as shown in FIG. 1A. As shown in FIG. 2B, there are only traces of microsegregation of prior aluminum powder particles 20 of about 10–30 μm in diameter. Additionally, in the method of the present invention and as shown in FIG. 2C, no interfacial reaction layer 40, as seen in FIG. 1C, is evident between the aluminum 20 and the non-aluminum metal 60 particles.

Generally, the sputter target of the present invention is formed from a hot pressed evacuated machined cylinder of a cold pressed blend of an aluminum powder and a non-aluminum reactive metal powder. Fabrication of an aluminum body to a powder preferably occurs by an inert gas atomization process in which a metal is first melted and allowed to pour through a nozzle to form a freely falling stream. The stream is impacted by a high-pressure, high velocity jet of an inert gas such as nitrogen, argon, or helium to generate a force sufficient to break the molten metal stream to a spray. Fabrication to a powder may also occur by other processes known to one skilled in the art such as a mechanical comminution process. The morphology of the powder may be substantially spheroidal, angular (defined as having a substantially needle-like shape), or granular (defined has having a substantially grain-like shape).

A non-aluminum second metal body is similarly fabricated, preferably by a hydride-dehydride process. In other embodiments an inert-gas atomization process, or any other process known to one skilled in the art, may be used to fabricate the metal body to a powder. The morphology of the powder may be substantially spheroidal, angular (defined as having a substantially needle-like shape), or granular (defined as having a substantially grain-like shape). The second non-aluminum metal may be any non-aluminum metal that is known to react with aluminum, typically titanium, tantalum, niobium, zirconium, iron or nickel.

In a preferred embodiment, the aluminum and non-aluminum metal powders thus formed are less than about 45 μm in diameter, although coarser powders up to about 300 μm in diameter may be used. The use of powders less than about 45 μm in diameter results in only traces of microsegregation of the powder particles 20, as shown in FIG. 2B. The powders may have a spheroidal, angular, or granular morphology. A capacitor-grade powder, that is, a powder with a very high specific surface area and a particle size formed by a sodium reduction process, is preferably avoided.

The fabricated aluminum and non-aluminum metal powders are blended for at least two hours. Blending for this period prevents the macroscopic segregation of aluminum into agglomerates 30 in a sputter target, as shown in FIG. 1A. In one embodiment, the powders are added to a polypropylene jar containing 1" long by 0.5" wide cylinders of pure aluminum to ensure homogeneous blending. The jar size may vary depending upon the particular powder batch size. A lubricating agent may also be added to the powders to facilitate blending and prevent clumping of the aluminum and non-aluminum metals. The lubricating agent may be a solvent such as an alcohol, for example, methanol, or acetone. The lubricating agent may also be a binder such as stearic acid or stearates.

The blended aluminum and non-aluminum powder is then subjected to cold pressing. The blended powder may be loaded into a bag made of natural rubber, latex, butyl, nitrile, polyurethane, polyvinyl chloride, neoprene or silicone, and the bag sealed before pressing. Alternatively, the blended powder may be pressed without bagging by pouring the blended powder into a mold and applying pressure directly to the mold. The blended power is then subjected to cold isostatic pressing (CIP), defined as pressing without added heat (that is, pressing at room temperature) and applying pressure. Pressing may be either uniaxial, biaxial or hydrostatic and is performed at a pressure of about 30 ksi.

The pressed powder blend is a blank, which is an intermediate form of the blend which is not a powder but is not yet in a final shape. The blank is machined into a right cylinder, that is, a cylinder having a base that is perpendicular to the side of the cylinder. Machining can occur by any standard method known to one skilled in the art, but is preferably performed by a lathe. The machined cylinder is loaded into a can having dimensions that are substantially close to that of the starting cylinder. The can is preferably made of steel, but may be made of another metal, for example zircon. The can composition depends upon the melting temperature and the reactivity of the metal of the can with the non-aluminum metal. The can is heated to about 400° C., subjected to a vacuum of about $10^{-3}$ torr, and sealed. The sealed can is subjected to hot isostatic pressing (HIP). Hot isostatic pressing in either a uniaxial, biaxial, or hydrostatic direction occurs at a temperature below 0.9 $T_m$ of aluminum (the melting temperature in degrees Kelvin of aluminum) and at a pressure of about 5 ksi.

In an alternate embodiment, blanks as small as around 0.5 inch in diameter may be formed. The aluminum and non-aluminum metal powders are fabricated and blended as previously described. The blended powders are pressed, preferably using either cold pressing or cold isostatic pressing, and then assembled into a mosaic. The mosaic, an assembly of a few, typically four to five, pieces that when aggregated make up a shape, is then subjected to hot pressing. Hot pressing, by either hot isostatic pressing, vacuum hot pressing, inert gas hot pressing, or pressure-less sintering, occurs at a temperature below 0.9 $T_m$ of aluminum. The mosaic then forms a one piece unreacted non-aluminum metal/aluminum sputter target.

The resulting sputter target formed by the method of the present invention contains greater than about 2% to about 5% by weight of aluminum. As shown in FIGS. 2A and 2B, the sputter target is substantially free of aluminum agglomerates 30, as seen in FIG. 1A. As shown in FIG. 2C, the resulting sputter target also has no interfacial reaction layer 40, which is characterized by the presence of a third component other than an aluminum 20 and non-aluminum metal 60. The third component that forms the interfacial reaction layer 40 may be formed by the reaction of the aluminum 20 with the non-aluminum 60 particles, or may be formed by the reaction of oxygen with either the aluminum 20 or non-aluminum metal 60 particles, or may result from the reaction of either the aluminum 20 or non-aluminum metal 60 particles with any impurity that may be present, such as an impurity in the solvent or binder. The reactive sputter target is also substantially free of voids, has a substantially uniform body, and has a density of at least 99% as determined by the Archimedes method, known to one skilled in the art, with a purity greater than 99.95% by weight. The amounts of impurities are as follows:

| | |
|---|---|
| Calcium < 20 ppm | Chromium < 50 ppm |
| Copper <20 ppm | Cobalt < 50 ppm |
| Iron < 35 ppm | Potassium < 200 ppm |
| Magnesium < 25 ppm | Lithium < 50 ppm |
| Manganese < 50 ppm | Molybdenum < 35 ppm |
| Nickel < 20 ppm | Sodium < 200 ppm |
| Niobium < 30 ppm | Silicon < 50 ppm |
| Tungsten < 60 ppm | Strontium < 20 ppm |
| Titanium < 50 ppm | |

The product thus formed is not limited by compositions and does not use any sintering, reactive sintering, or reactive hot-pressing as a method of manufacture.

EXAMPLE

One hundred and fifty grams of an aluminum powder of approximately 45 $\mu$m and 99.99% purity, and 1000 grams of a tantalum powder of approximately 45 $\mu$m and 99.95% purity, were used to fabricate a sputter target composed of 50 atomic percent of aluminum and 50 atomic percent of tantalum that is 13 percent by weight of aluminum. The mass-median particle size was 20–25 $\mu$m in diameter. The powders were loaded into a polypropylene jar under an inert gas such as argon and tumbled for two hours to blend the powders. Pure aluminum cylinders, 1" long×0.5" wide, were included in the jar during blending to eliminate the possibility of nonhomogeneity during blending. The blended powder was loaded into a bag whose size was substantially the same as the cylinder, then the bag was vacuum-sealed. The bag was subjected to cold isostatic pressing under a pressure of about 30 ksi to achieve a density greater than 80% of theoretical. The cold isostatic pressed blank was machined using a lathe into a right cylinder, loaded into a steel can, vacuum sealed, and subjected to hot isostatic pressing at 550° C. under a pressure of at least 5 ksi to reach greater than 99% of theoretical density.

The density of the resulting sputter target, as measured by the Archimedes method, was 9.80 g/cc at the edge, 9.83 g/cc at the mid-region, and 9.81 g/cc at the center, translating to a percent of theoretical of 99.0% at the edge, 99.2% at the mid-region, and 99.1% at the center. The theoretical density is calculated to be 9.95 g/cc by the Rule of Mixtures, as known to one skilled in the art, for a 50—50 atomic mix of aluminum and tantalum, that is, a mixture of 13 percent by weight of aluminum and 87 percent by weight of tantalum. The resulting target was substantially free of aluminum agglomerates 30 and had no interfacial reaction layer 40. No voids were detected when the target was viewed under scanning electron microscopy.

While the present invention has been illustrated by a description of embodiments and an example, and while the illustrative embodiments and example have been described in considerable detail, it is not the intention of the inventors to restrict or in any way limit the scope of the appended claims to such detail. Additional advantages and modifications will readily appear to those skilled in the art. For example, hammer forging may be used instead of pressing. As another example, the blended powder may be poured into a mold, and pressure and temperature may be applied directly to the mold without using a bag or can to contain the powder. The invention in its broader aspects is therefore not limited to the specific details, representative apparatus and methods, and illustrative examples shown and described. Accordingly, departures may be made from such details without departing from the spirit or scope of applicants' general inventive concept.

Having described the invention, what is claimed is:

1. A method of making a high performance high density sputter target comprising:

blending a powder of substantially pure non-aluminum metal capable of reacting with aluminum and a powder of substantially pure aluminum metal to form a uniform mixture of the powders of the metals, then cold pressing the blended powders, then machining the blended cold pressed powders into a cylinder, and then compacting the machined cylinder to high density by a process consisting essentially of isostatically pressing the cylinder under vacuum at a temperature of at least about 400° C. to obtain a high density target material consisting of a homogeneous mixture containing essentially no macroscopic segregation of aluminum, containing at most only traces of microsegregation of aluminum, and containing essentially no intermetallic compounds of the metals.

2. The method of claim 1, wherein the non-aluminum metal is selected from the group consisting of tantalum, titanium, niobium, zirconium, iron and nickel.

3. The method of claim 1, further comprising obtaining the powder of substantially pure non-aluminum metal by fabricating a non-aluminum metal body.

4. The method of claim 3, wherein fabricating is by a method selected from the group consisting of a hydride-dehydride process and an inert gas atomization process.

5. The method of claim 3, wherein fabricating is to a morphology selected from the group consisting of spheroidal, angular, and granular.

6. The method of claim 1, wherein the powder of substantially pure non-aluminum metal is between about 6 $\mu$m and about 300 $\mu$m.

7. The method of claim 1, wherein the powder of substantially pure non-aluminum metal is between about 6 $\mu$m and about 45 $\mu$m.

8. The method of claim 1, further comprising obtaining the powder of substantially pure aluminum metal by fabricating an aluminum metal body.

9. The method of claim 8, wherein fabricating is by a method selected from the group consisting of a hydride-dehydride process and an inert-gas atomization process.

10. The method of claim 1, wherein the powder of substantially pure aluminum metal has a spheroidal morphology.

11. The method of claim 1, wherein the powder of substantially pure aluminum metal is less than about 300 $\mu$m.

12. The method of claim 1, wherein the powder of substantially pure aluminum metal is less than about 45 $\mu$m.

13. The method of claim 1, wherein the powders are blended with cylinders of pure aluminum for at least 2 hours.

14. The method of claim 1, wherein the blending step includes blending with a substance selected from the group consisting of a solvent, a binder, and mixtures thereof.

15. The method of claim 14, wherein the solvent is selected from the group consisting of alcohols or acetone.

16. The method of claim 14, wherein the binder is selected from the group consisting of stearic acid or stearates.

17. The method of claim 1, wherein the cold pressing step includes cold isostatic pressing at a pressure of about 30 ksi.

18. The method of claim 1, wherein the cold pressing step includes cold pressing in a direction selected from the group consisting of uniaxial, biaxial or hydrostatic.

19. The method of claim 1, wherein the isostatic pressing step includes pressing under a vacuum of at least about $10^{-3}$ torr.

20. The method of claim 1, wherein the isostatic pressing step includes pressing at a temperature less than $0.9\ T_m$ of aluminum and at a pressure of at least about 5 ksi.

21. A method of making a high performance, high density sputter target, comprising:

blending a powder of substantially pure aluminum having an average particle size less than about 45 μm with a powder of substantially pure tantalum having an average particle size of less than about 45 μm for at least two hours to form a uniform mixture of the powders of the metals, then cold isostatic pressing the blended powders at a pressure of about 30 ksi to form a blank, then machining the blank into a right cylinder, and then hot isostatic pressing the machined cylinder at a temperature of about 550° C. and a pressure of about 5 ksi to obtain a high density target material consisting of a homogeneous mixture containing essentially no macroscopic segregation of aluminum, containing at most only traces of microsegregation of aluminum, and containing essentially no intermetallic compounds of the metals.

22. A method of making a high performance, high density sputter target, comprising:

blending a powder of substantially pure non-aluminum metal capable of reacting with aluminum and a powder of substantially pure aluminum metal to form a uniform mixture of the powders of the metals, then cold pressing the blended powders by a method selected from the group consisting of cold pressing and cold isostatic pressing, assembling a mosaic of the cold pressed powders, and isostatically pressing the mosaic by a method selected from the group consisting of
  hot isostatic pressing,
  vacuum hot pressing, and
  inert gas hot pressing
at a temperature below $0.9\ T_m$ of aluminum to obtain a high density target material consisting of a homogeneous mixture containing essentially no macroscopic segregation of aluminum, containing at most only traces of microsegregation of aluminum, and containing essentially no intermetallic compounds of the metals.

23. A method of making a high performance, high density sputter target, comprising:

blending a powder of substantially pure non-aluminum metal capable of reacting with aluminum and a powder of pure aluminum metal to form a uniform mixture of the powders of the metals, cold pressing the blended powders, machining the blended cold pressed powders into a cylinder, and hot pressing the cylinder under a vacuum at a temperature above about 400° C. to obtain a high density target material consisting of a homogeneous mixture containing essentially no macroscopic segregation of aluminum, containing at most only traces of microsegregation of aluminum, and containing essentially no intermetallic compounds of the metals.

* * * * *